United States Patent [19]
Okita

[11] Patent Number: 5,212,700
[45] Date of Patent: May 18, 1993

[54] MODULATION CIRCUIT FOR A LIGHT EMISSION DEVICE

[75] Inventor: Toshio Okita, Yokohama, Japan

[73] Assignee: Sumitomo Electric Industries, Ltd., Osaka, Japan

[21] Appl. No.: 735,262

[22] Filed: Jul. 24, 1991

[51] Int. Cl.$^5$ .............................................. H01S 3/00
[52] U.S. Cl. ........................................ 372/38; 372/26; 372/31
[58] Field of Search ............................. 372/38, 26, 31

[56] References Cited

U.S. PATENT DOCUMENTS 4,092,530  5/1978  Wise ........................................ 372/31
5,019,769  5/1991  Levinson ................................ 372/29
5,036,519  7/1991  Ema et al. ............................... 372/38

Primary Examiner—Léon Scott, Jr.
Attorney, Agent, or Firm—Cushman, Darby & Cushman

[57] ABSTRACT

A modulation circuit for controlling a light emission device to produce an intensity-modulated light signal based on an input modulation signal. The modulation circuit includes a level detector and an attenuator. The level detector produces an electrical signal corresponding to an amplitude level of the input modulation signal. The attenuator attenuates the input modulation signal based on the electrical signal, and applies the attenuated input modulation signal to said light emission device.

7 Claims, 3 Drawing Sheets

MODULATION CIRCUIT FOR A LIGHT EMISSION DEVICE

BACKGROUND OF THE INVENTION

1. Field of the Invention

The present invention relates to a modulation circuit for a light emission device, and more particularly to a laser diode modulation circuit of a direct modulation type which applies a modulation signal to a laser diode to produce a intensity-modulated optical signal.

2. Related Background Art

Transmission service of a multi-channel video signal and a CATV system which offers a two-way data communication service have recently been started. The CATV system uses an optical fiber cable to a coaxial cable, and an optical/coaxial hybrid CATV system which is a combination of both systems has also been required. In a VSB-AM (Vestigial Side Band-Amplitude Modulation) optical transmitter in such a system, a laser diode modulation circuit for intensity-modulating the laser diode is used.

A conventional laser diode modulation circuit is shown in FIG. 1. a modulation signal applied to an input terminal 1 is applied to a laser diode (LD) 3 through a variable attenuator 2 to directly modulate it. In order to improve a C/N ratio (carrier to noise ratio), the attenuation by the variable attenuator 2 is selected to a maximum (optimum modulation depth) which does not cause overmodulation of the level of the modulation signal. After the adjustment, the attenuation is fixed for the optical modulation.

However, in the prior art, if the level of the modulation signal varies, the overmodulation or undermodulation occurs. Namely, if the amplitude level of the modulation signal varies due to a temperature change of other factor after the adjustment to the optimum modulation factor, the modulation depth of the laser diode shifts from the optimum. As a result, the transmission characteristic is deteriorated.

SUMMARY OF THE INVENTION

It is an object of the present invention to provide which attains the modulation at an optimum modulation depth even if a surrounding environment such as a temperature changes so that degradation of transmission quality is prevented.

The modulation circuit for the light emission device of the present invention comprises; level detector mean for producing a signal corresponding to an amplitude level of modulation of the input modulation signal; and attenuator means for attenuating the input modulation signal for application to the light emission device; the attenuation by said attenuation means being variable with the output signal of the level detector means.

Accordingly, when the amplitude level of the modulation signal varies by the temperature change, it is detected by the level detector and the attenuation in the variable attenuator is changed in accordance therewith. Thus, the modulation signal of a proper level is applied to the laser diode, and the drive signal having a constant average power is applied to the laser diode. Accordingly, the optimum modulation depth is maintained.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENTS

An optical transmitter to which the laser diode modulation circuit of one embodiment of the present invention is applied is an apparatus which produces an optical signal by intensity-modulating a light emission device by a high frequency-multiplexed electrical signal. Since the light emission device should be of high output power (for example, +6 dBm) and high speed response (for example, 2 GHz), it is preferable to use a laser diode.

Figure 1:
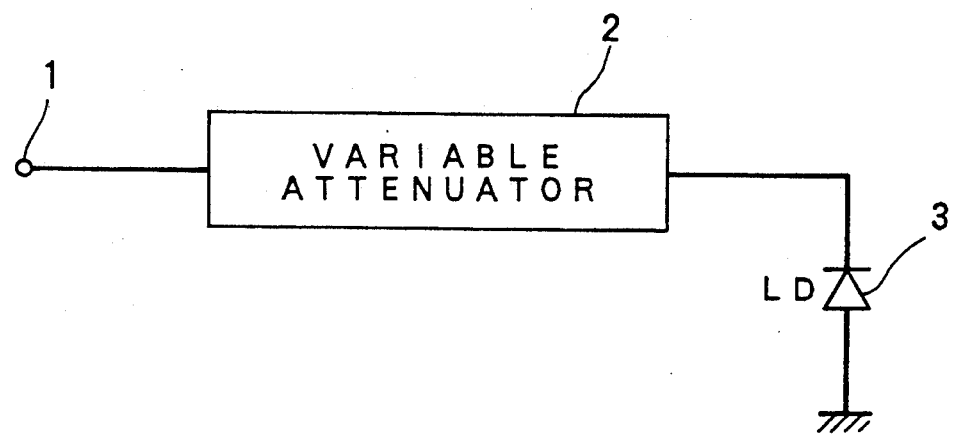
FIG. 1 shows a prior art configuration.
Figure 2:
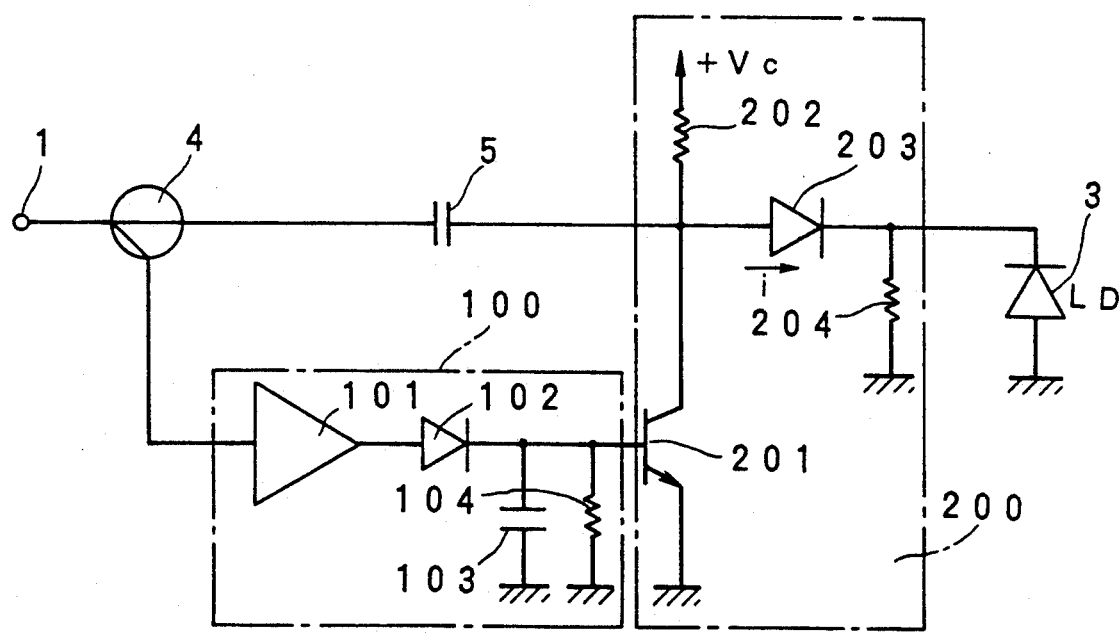
FIG. 2 shows a configuration of one embodiment of a laser diode modulation circuit of the present invention.

The laser diode modulation circuit of the embodiment is explained with reference to FIGS. 2 and 3. A modulation signal applied to an input terminal 1 may be a video signal of a frequency-multiplexed VSB-AM and it is branched at a predetermined branch ratio by a branch circuit 4 which may comprise a transformer. One of the branched signals is supplied to a level detector 100, which amplified the input signal with a predetermined gain by an amplifier 101 and applies the amplified signal to a detector comprising a diode 102, a capacitor 103 and a resistor 104 to produce a DC level, which reflects the amplitude level of the input modulation signal to the input terminal 1.

On the other hand, the other of the branched modulation signals is supplied to a variable attenuator 200 through a DC cutting capacitor 5. The variable attenuator 200 comprises a current controlling transistor 201 and a pin diode 203. The output signal of the level detector 100 is applied to a base of the transistor 201 to control a through a resistor 202. In this manner, the current flowing into the pin diode 203 is changed to change the resistance of the pin diode 202. A DC conducting resistance 204 is connected between an anode of the pin diode 203 and ground.

Figure 3:
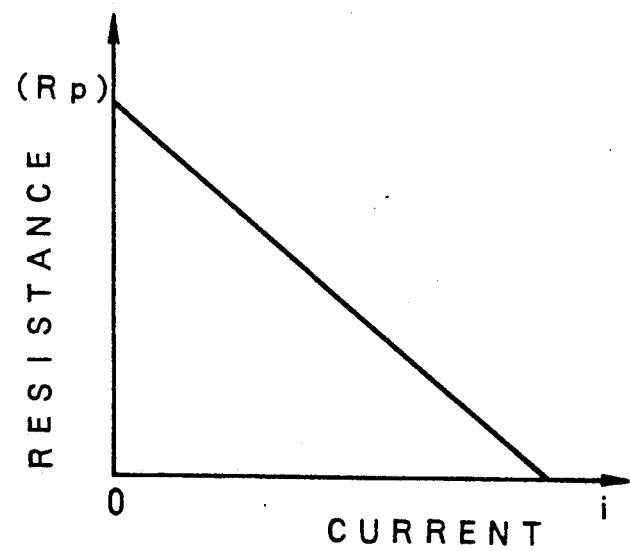
FIG. 3 shows a current-resistance characteristic of a pin diode.

FIG. 3 shows a characteristic of the current i flowing into the pin diode 203 the resistance Rp thereof. As the forward current i of the pin diode 203 increased, the forward resistance Rp decreases. The output of the variable attenuator 200 is supplied to the laser diode 3. The capacitor 5 is provided to cut the DC from a power supply (+VC) from reaching the input terminal 1.

In the above laser diode modulation circuit, when the amplitude level of the modulation signal applied to the input terminal 1 increases by the temperature change, the output signal of the level detector 100 increases and the current flowing between the collector and the emitter of the transistor 201 increases. As a result, the current i flowing into the pin diode 203 decreases and the resistance Rp thereof increases as shown in FIG. 3. Thus, the attenuation increases and the overmodulation due to the increase of the amplitude level of the level detector 100 decreases and it is applied to the fuse of the current controlling transistor 201. Thus, the current flowing into the transistor 201 increases and the current i flowing into the pin diode 203 increases, and the resistance Rp thereof decreases as shown in FIG. 3. As a result, the attenuation decreases and the undermodulation is prevented.

The variation of the amplitude level of the modulation signal applied to the laser diode modulation circuit is detected by the level detector 100, and the attenuation of the modulation signal is varied in accordance therewith and it is supplied to the laser diode. Thus, the overmodulation or under modulation due to the variation of the level of the modulation signal by the temperature change is prevented. Since the average power of the modulation signal applied to the laser diode is kept constant, the deterioration of transmission characteristics is prevented.

The configurations of the level detector 100 and the variable attenuator 200 of the present embodiment are mere examples and other configurations may be used. The light emission device may be a light emission diode (LED). While the transformer which is a directional branch is used as the branch means in the embodiment, the modulation signal may be branched by a resistor coupling.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A modulation circuit for controlling a light emission device to produce an intensity-modulated light signal based on an input modulation signal, the modulation circuit comprising;

level detector means for producing an electrical signal corresponding to an amplitude level of the input modulation signal; and attenuator means for attenuating the input modulation signal based on the electrical signal, and for applying the attenuated input modulation signal to said light emission device.

2. A modulation circuit for a light emission device according to claim 1, further comprising branch means for receiving and branching the input modulation signal to said level detector means and said attenuator means.

3. A modulation circuit for a light emission device according to claim 1 wherein the modulation signal is a VSB-AM signal.

4. A modulation circuit for a light emission device according to claim 1, wherein said light emission device is a laser diode.

5. A modulation circuit for a light emission device according to claim 1, wherein said input modulation signal is applied to said attenuator means through a capacitor to cut a DC component from said input modulation signal.

6. A modulation circuit for a light emission device according to claim 1, wherein said level detector means includes amplification means for amplifying the input modulation signal and detection means for producing said electrical signal corresponding to an amplitude of the amplified input modulation signal.

7. A modulation circuit for a light emission device according to claim 1, wherein said attenuator means includes:

a pin diode receiving an attenuating current, said pin diode having a resistance variable with the attenuating current flowing there through, the pin diode attenuates said input modulation signal based on the attenuating current received by said pin diode; and current control means for controlling the attenuating current flowing through the pin diode based on said electrical signal produced by said level detector means.

* * * * *